United States Patent
Somervell et al.

(10) Patent No.: US 9,978,618 B2
(45) Date of Patent: May 22, 2018

(54) HOT PLATE WITH PROGRAMMABLE ARRAY OF LIFT DEVICES FOR MULTI-BAKE PROCESS OPTIMIZATION

(71) Applicant: Tokyo Electron Limited, Minato-ku, Tokyo (JP)

(72) Inventors: Mark Somervell, Austin, TX (US); Josh Hooge, Austin, TX (US); Michael Carcasi, Austin, TX (US)

(73) Assignee: Tokyo Electron Limited, Tokyo (JP)

(*) Notice: Subject to any disclaimer, the term of this patent is extended or adjusted under 35 U.S.C. 154(b) by 0 days. days.

(21) Appl. No.: 15/287,877

(22) Filed: Oct. 7, 2016

(65) Prior Publication Data
US 2018/0102265 A1    Apr. 12, 2018

(51) Int. Cl.
| H01L 21/00 | (2006.01) |
| H01L 21/67 | (2006.01) |
| H01L 21/68 | (2006.01) |
| H01L 21/687 | (2006.01) |
| H01L 21/027 | (2006.01) |

(52) U.S. Cl.
CPC .. H01L 21/67115 (2013.01); H01L 21/67253 (2013.01); H01L 21/67259 (2013.01); H01L 21/68 (2013.01); H01L 21/68742 (2013.01); *H01L 21/027* (2013.01)

(58) Field of Classification Search
CPC ........... H01L 21/68742; H01L 21/6875; H01L 21/67103; H01L 21/67098; H01L 21/67106; H01L 21/67115; H01L 21/28176; H01L 21/28185; H01L 21/76828; H01L 21/76864; H01L 21/02694; H01L 21/324–21/3247; H01L 31/186–31/1872; H01L 31/208
See application file for complete search history.

(56) References Cited

U.S. PATENT DOCUMENTS

| 8,003,919 B2 | 8/2011 | Goto et al. |
| 8,052,419 B1 | 11/2011 | Nordin et al. |
| 2006/0005770 A1* | 1/2006 | Tiner ................ H01L 21/68742 118/728 |

(Continued)

OTHER PUBLICATIONS

Shigehiro Goto, et al., "The New Bake Plate Optimized for a PEB Process." Advances in Resist Technology and Processing XXIII, Proc. of SPIE vol. 6153.61534N-1-61534N-8 (2006).

*Primary Examiner* — Selim Ahmed
*Assistant Examiner* — Evan Clinton
(74) *Attorney, Agent, or Firm* — Wood Herron & Evans LLP

(57) ABSTRACT

Embodiments of systems and methods for substrate thermal processing using a hot plate with a programmable array of lift devices for multi-bake process optimization are presented. In an embodiment, an apparatus includes a base with an upper surface configured to receive the substrate. The base may include at least one heater for heating the substrate while on or in the vicinity of the base, and a plurality of lift devices configured to selectively extend from the upper surface of the base to support the substrate above the base when extended, and allow the substrate to rest on the upper surface of the base when retracted, each lift device being actuated independently of the other lift devices by an actuating mechanism. Additionally, the apparatus may include a controller for controlling the plurality of actuating mechanisms.

19 Claims, 11 Drawing Sheets

(56) References Cited

U.S. PATENT DOCUMENTS

| | | |
|---|---|---|
| 2009/0080480 A1 | 3/2009 | Herchen |
| 2011/0236162 A1* | 9/2011 | Shikayama ....... H01L 21/68742 414/222.01 |
| 2012/0070996 A1* | 3/2012 | Hao .................. H01L 21/68742 438/710 |
| 2016/0017497 A1* | 1/2016 | Rajagopalan ........... H01L 21/00 118/712 |

* cited by examiner

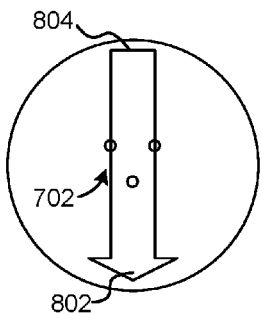 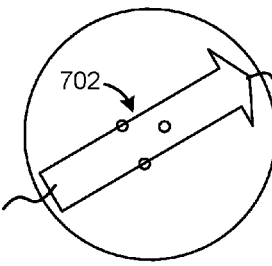 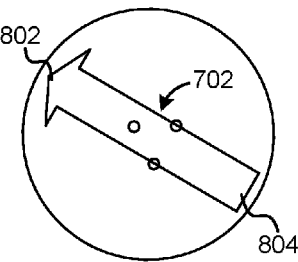
FIG. 9A            FIG. 9B            FIG. 9C
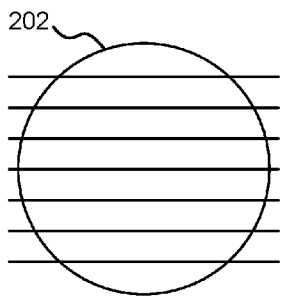 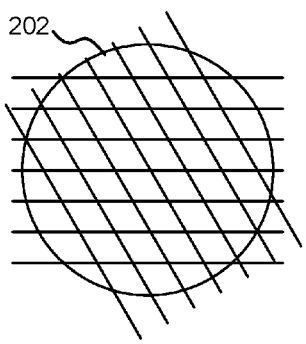 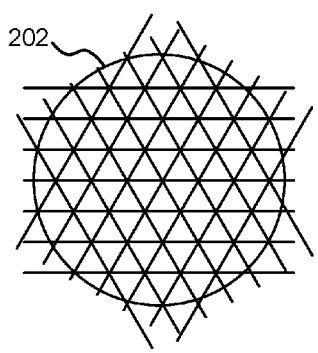
FIG. 10A           FIG. 10B           FIG. 10C
| GAP | 1mm | 5mm | 10mm | 15mm |
|---|---|---|---|---|
| 300 (deg. C) | | | | |
| Range | 8.01 | 29.05 | 41.09 | 55.0 |
FIG. 11

HOT PLATE WITH PROGRAMMABLE ARRAY OF LIFT DEVICES FOR MULTI-BAKE PROCESS OPTIMIZATION

BACKGROUND OF THE INVENTION

Field of Invention

The present invention relates to systems and methods for substrate processing, and more particularly to systems and methods for substrate thermal processing using a hot plate with a programmable array of lift devices for multi-bake process optimization.

Description of Related Art

Semiconductor device manufacturing typically involves photolithography processes for forming patterned layers on a substrate. Often, the photolithography processes include steps for coating a surface of the substrate with one or more radiation-sensitive coatings, such as photoresist. Radiation-sensitive coatings are typically formed by spinning a photoresist material onto the surface and then curing or baking the coating. The radiation-sensitive coating may then be exposed to patterned radiation, which causes some portions of the radiation-sensitive coating to become altered. The radiation-sensitive layer may then be developed into a patterned layer, as defined by the radiation exposure pattern.

One step of a photolithography process is a Post Exposure Bake (PEB) process. The PEB process serves multiple purposes in photoresist processing. First, the elevated temperature of the bake drives the diffusion of the photoproducts in the resist. A small amount of diffusion may be useful in minimizing the effects of standing waves, which are the periodic variations in exposure dose throughout the depth of the resist coating that result from interference of incident and reflected radiation. Another main purpose of the PEB may be to drive an acid-catalyzed reaction that alters the solubility of the polymer layer used in many chemically amplified resists. PEB may also play a role in removing solvent from the wafer surface.

Depending upon the materials used, the PEB process can require a large range of potential temperatures. Often a single wafer is run at a given temperature in order to understand the impact of that temperature setting, and then feedback is provided to the process to optimize bake parameters. Different wafers and wafer coatings are also required for time learning. As the number of spin-on processes in a wafer flow increases, the bake process optimization of these multiple processes becomes even more cumbersome.

In addition to the PEB, there are a host of other bake processes used in lithographic patterning. For standard resist processing, the post-apply bake is used to stabilize the film after the spin coating process and can impact key lithographic parameters like exposure dose, critical dimension uniformity (CDU) and linewidth roughness (LWR). Bake processes are also typically used to form each layer of a tri-layer spin-on stack that is common industry stack for reflectivity control. The tri-layer stack typically includes an underlayer (e.g. spin on carbon), a SiARC layer, and an upper polymer resist layer. Specific to the upper polymer resist layer, bake processes are used for the PEB, but also used for post-apply bake and hard bake. Additionally, bake processes may be used for crosslinking films or for annealing of organic films. Such steps are commonly used in directed self-assembly (DSA) processes, where mat layers are cross-linked, and block copolymers are heated to enable phase separation of dissimilar blocks.

SUMMARY OF THE INVENTION

Embodiments of systems and methods for substrate thermal processing using a hot plate with a programmable array of lift devices for multi-bake process optimization are presented. In an embodiment, an apparatus includes a base with an upper surface configured to receive the substrate. The base may include at least one heater for heating the substrate while on or in the vicinity of the base, and a plurality of lift devices configured to selectively extend from the upper surface of the base to support the substrate above the base when extended, and allow the substrate to rest on the upper surface of the base when retracted, each lift device being actuated independently of the other lift devices by an actuating mechanism. Additionally, the apparatus may include a controller for controlling the plurality of actuating mechanisms.

An embodiment of a method includes mounting the substrate on a base, where the base includes an upper surface, at least one heater, and a plurality of lift devices configured to selectively extend from the upper surface of the base to support the substrate above the base when extended, and allow the substrate to rest on the upper surface of the base when retracted, each lift device being actuated independently of the other lift devices by an actuating mechanism. Additionally, the method may include actuating the plurality of actuating mechanisms to set the substrate in a first tilted position, the first tilted position forming a first non-uniform gap between the substrate and the upper surface of the base, the first tilted position having a first azimuthal orientation. The method may further include exposing the substrate to a first baking process by energizing the at least one heater. In an embodiment, the method may also include actuating the plurality of actuating mechanisms to set the substrate in a second tilted position, the second tilted position forming a second non-uniform gap between the substrate and the upper surface of the base, the second tilted position having a second azimuthal orientation. The method may also include exposing the substrate to a second baking process by energizing the at least one heater.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

FIG. 9A illustrates an embodiment of a tilt axis of a wafer in a system for substrate thermal processing using a hot plate with a programmable array of lift devices for multi-bake process optimization.

FIG. 9B illustrates an embodiment of a tilt axis of a wafer in a system for substrate thermal processing using a hot plate with a programmable array of lift devices for multi-bake process optimization.

FIG. 9C illustrates an embodiment of a tilt axis of a wafer in a system for substrate thermal processing using a hot plate with a programmable array of lift devices for multi-bake process optimization.

FIG. 10A illustrates a temperature gradient on a wafer resulting from the tilt of FIG. 9A.

FIG. 10B illustrates a temperature gradient on a wafer resulting from the tilt of FIG. 9B.

FIG. 10C illustrates a temperature gradient on a wafer resulting from the tilt of FIG. 9C.

FIG. 11 illustrates temperature gradients resulting from the tilt a wafer at a set of gap heights.

DETAILED DESCRIPTION OF EMBODIMENTS OF THE INVENTION

Figure 1:
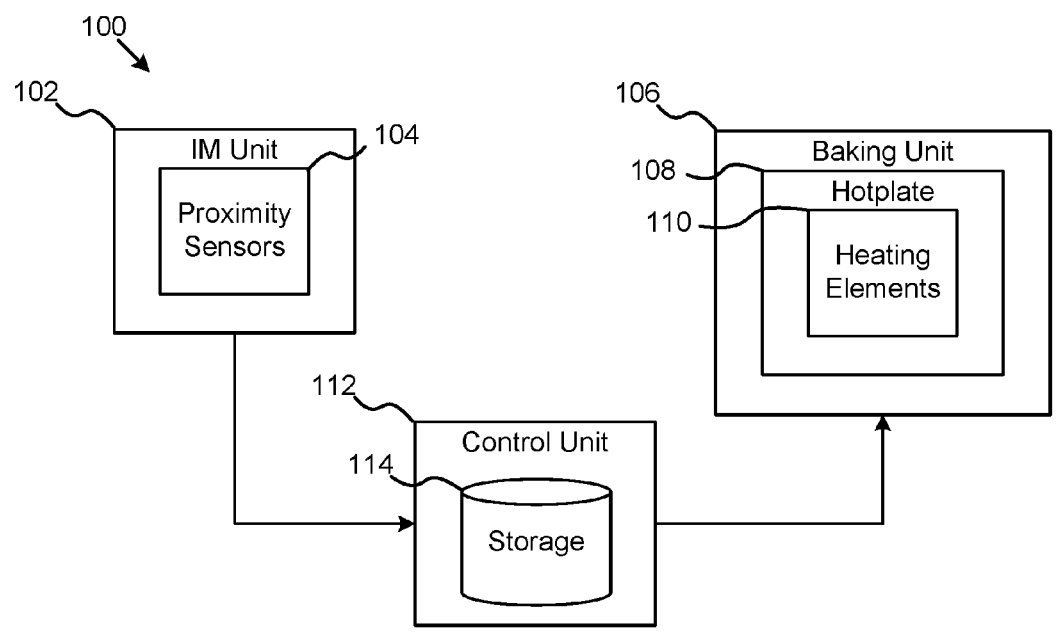
FIG. 1 is a diagrammatic view of a thermal processing apparatus including an inline metrology unit and a baking unit.

Systems and methods for substrate thermal processing using a hot plate with a programmable array of lift devices for multi-bake process optimization are presented. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Referring now to the drawings, where like reference numerals designate identical or corresponding parts throughout the several views.

Figure 2:
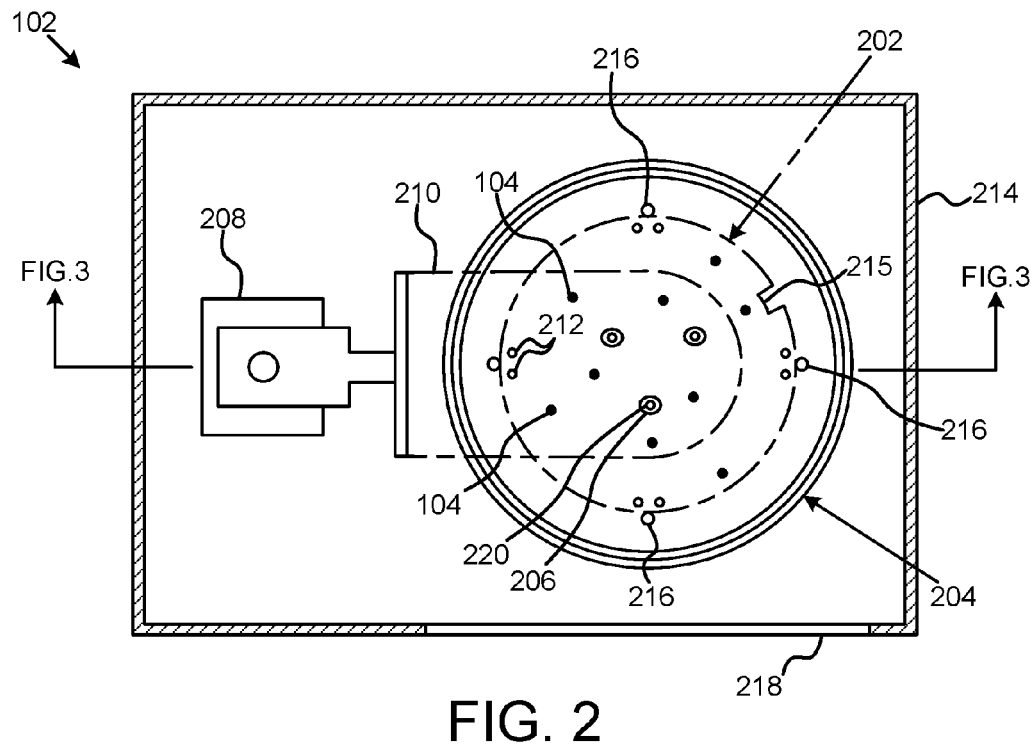
FIG. 2 is a top plan view of an inline metrology unit of a thermal processing apparatus.

With reference to FIGS. 1-2, a wafer (as illustrated as wafer 202 in FIG. 2) is processed in the thermal processing apparatus 100 as shown in FIG. 1. The wafer 202 is initially transferred to the IM unit 102, as part of a flow for processing the wafer 202. A series of proximity sensors 104 may obtain a plurality of distance measurements in the IM unit 102. These measured distances may then be stored in the control unit 112, for example in storage 114. In other embodiments, the measured distances may be transferred and stored offline. The measured distances may then be used by the control unit 112 to activate and control the heating elements 110 of a hotplate 108 contained in a baking unit 106 as the wafer 202 is being transferred to the baking unit 106. In an embodiment, the control unit 112 may control a height of one or more lift devices 220 (shown in FIG. 2) for adjusting a gap between the wafer 202 and the heating elements 110. In one embodiment, a plurality of lift devices 220 may be independently adjusted by the control unit 112 for orienting the wafer in a tilted position relative to the heating elements 110. In such an embodiment, the tilt may be along one of a plurality of tilt axes. In one embodiment, the lift devices 220 may include lift pins. Alternatively, the lift devices 220 may be lift arms, or other independently drivable supports. In another embodiment, the plurality of lift devices 220 may be replaced with one or more lift platforms. One of ordinary skill may recognize additional embodiments of lift devices, including for example, suspension devices, adjustable edge clamps, and the like.

In a further embodiment, the control unit 112 may control the power supplied to the heating elements 110 to make adjustments to temperatures of the elements based on the measured distances to account for non-uniformities in the wafer 202 and to provide for a uniform heating of the wafer 202. Although the IM unit 102, the control unit 112 and the baking unit 106 are illustrated as separate devices in FIG. 1, one of ordinary skill will recognize that one or more of these components may be integrated into a single unit or subcombination of units. For example, in an embodiment components of the IM unit 102, such as sensors, may be integrated with the hotplate 108.

Figure 3:
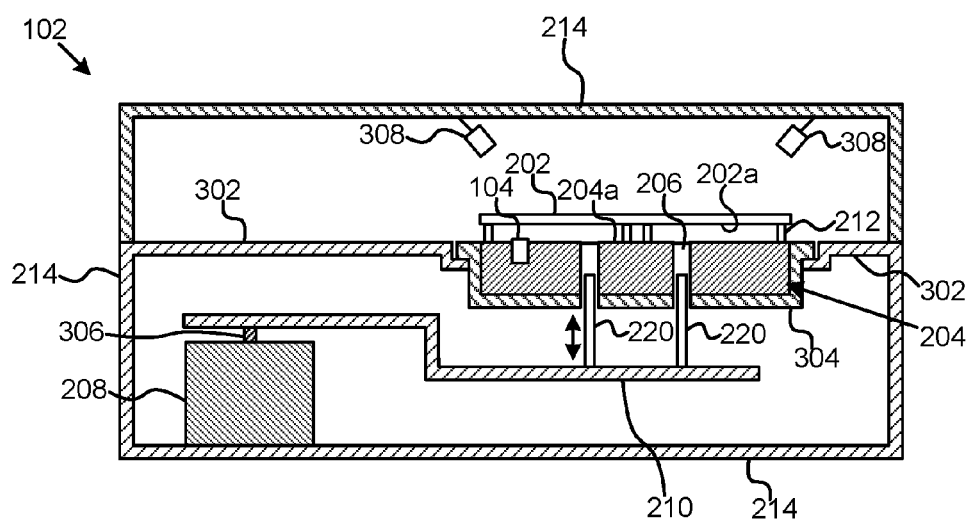
FIG. 3 is a cross-sectional view of an inline metrology unit of a thermal processing apparatus, the cross-section taken a line indicated in FIG. 2.

In an embodiment as shown in FIG. 3, the inline metrology unit 102 of the thermal processing apparatus 100 may comprise a series of outer walls 214 which house a cylinder 208, common base and support arm 210, a base 204, and a horizontal support wall 302. The base 204 may be positioned in a circular cut out in the horizontal support wall 302 and may be further supported by a horizontal supporting member 304. An opening 218 in the outer walls 214 allow for the wafer to be transferred to and from the inline metrology unit 102. In an alternative embodiment, the inline metrology unit 102 is not required, because one or more temperature sensors may be integrated with the hotplate 108.

The base 204 includes through holes 206 that align with lift devices 220. The lift devices 220 extend from the common base and support arm 210. The common base and support arm 210 are connected to, and supported by, a rod 306 of a vertical cylinder 208. When the rod 306 is actuated to protrude from the cylinder 208, the lift devices 220 protrude from the base 204, thereby lifting the wafer. Likewise, when the rod 306 is retracted into the cylinder 208 the lift devices 220 recede into the through holes 206 lowering the wafer toward a top surface 204a of the base 204. Projections 216 on the top surface 204 of the base 204 accurately position the wafer. In addition to the projections 216, the wafer may contain notch 215 that may be used to position the wafer in the inline metrology unit providing an orientation reference for the distance measurements. The top surface 204 also includes a plurality of proximity pins 212 configured to support the semi-conductor wafer from its bottom surface 202a so that the bottom surface 202a of a wafer does not contact the top surface 204a of the base 204 of the inline metrology unit 102. The proximity pins 212 in FIG. 2 may be spaced at a predetermined angular distance apart from each other, and configured to evenly support the wafer 202.

Although such an embodiment may be used for actuating all of the lift devices 220 simultaneously, one of ordinary skill will recognize that the structure described in FIGS. 2-3 may be adapted for independent actuation of the lift devices 220. For example, a plurality of support arms may be coupled to a plurality of cylinders 208, or other servo-type actuators, to articulate the lift devices 220, thereby providing options for tilting the wafer along a plurality of tilt axes. Additional or alternative configurations may exist, including for example, where each lift device is directly coupled to an independently driven servo, or another controllable actuator device.

The top surface 204a of the base 204 includes a plurality of proximity sensors 104. The number and location of the proximity sensors 104 may be determined by the configuration of the hotplate 108 in the baking unit 106. A sufficient number of proximity sensors 104 are utilized to provide sufficient data to control heating elements 110 in hotplate 108. Accordingly, the number of sensors 104 scales with the number of heating elements 110. In an embodiment in which the hotplate 108 has a series of concentric heating elements 110, each of the heating elements 110 may be monitored by at least 3 sensors 104, and these sensors 104 may be located at the same distance from a center point corresponding to one of the concentric heating elements 110. A variety of different types of proximity sensors 104 may be used including but not limited to infrared, acoustic, inductive, eddy current, and capacitive type proximity sensors, as well as laser interferometers.

The proximity sensors 104 are configured to determine the distances from a reference plane to the bottom surface 202a of the semiconductor wafer 202. The distance measurements obtained in the inline metrology unit 102 may be stored in control unit 112 for later use to control the hotplate 108 in the baking unit 106. Alternatively, thermal sensors may be used to determine effective temperature differences of a specific gap height configuration.

In addition to measuring the distances, in some embodiments, the IM unit 102 may also make other measurements to evaluate processing properties of the wafer. The IM unit 102 may provide a thickness measurement to confirm the photoresist film quality or the IM unit 102 may perform an analysis for patterned wafer defect (macro inspection). These measurements may be made simultaneously with the distance measurements using measuring device(s) 308 and are conventionally performed by making measurements on a top side of the wafer.

Wafer 202 may then be transferred to the other intervening modules for processing. Wafer 202 may then be transferred to a bake unit 106. In alternative embodiments, no transfer is needed when the baking unit 106 is integrated. In an embodiment, the post exposure bake activates the chemistry in the exposed regions of the photoresist. The topography data, which was measured in the inline metrology unit 102 and stored in the control unit 112, may be retrieved prior to the wafer arriving at the baking unit 106. In alternative embodiments, the topography data may be stored offline and delivered to the control unit 112 concurrently with the arrival of the wafer 202 at the baking unit 106. The topography data from the inline metrology unit 102 may be used to control the temperatures of heating elements 110 of the hotplate 108 to compensate for differences in distances of various points between the hotplate 108 and wafer 202.

Although the systems described in FIGS. 1-3 include several components which may be beneficial to operation of the systems, or may enhance operations, one of ordinary skill will recognize that certain elements may be modified or omitted without diverging from the scope of the present embodiments. For example, the proximity pins 212 and or projections 216 may be modified or omitted without necessarily impacting operation of the lift devices 220, depending upon system configurations. Additionally, the mechanisms for actuating the lift devices 220 may be modified, and certain components such as the support arm 210 may be omitted in some embodiments.

Figures 4, 5:
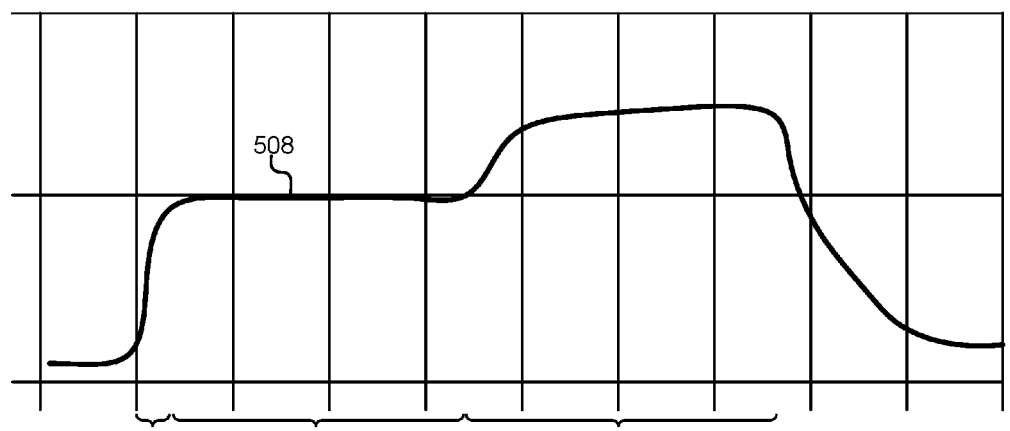
FIG. 4 illustrates a set of temperature control test parameters.
FIG. 5 illustrates temperature response for the temperature control test of FIG. 4.

FIG. 4 illustrates a set of temperature control test parameters, and FIG. 5 illustrates temperature response for the temperature control test of FIG. 4. In particular, FIG. 4 illustrates multiple gap control phases 402-406, and corresponding gap height 408-412 and target temperatures associated with each gap control phase 402-406. In an embodiment, the wafer 202 may be in close proximity to the heating elements 110, having a small gap height. Such an embodiment, may be referred to as a rapid heating phase 402. The temperature on the wafer surface with respect to time is illustrated as line 508 on the graph of FIG. 5. The first region 502 of the graph may correspond to the rapid heating phase 402 shown in FIG. 4. In a first temperature control phase 404, the gap height may to a slightly wider gap. In such an embodiment, the temperature on the wafer 202 may be substantially maintained at a second temperature range. The second region 504 on the graph of FIG. 5 may correspond to the first temperature control phase 404. In a second temperature control phase 406, the wafer 202 may be brought back into close proximity to the heating elements 110 and the temperature may increase to a third temperature range, as shown in the third region 506 of the graph in FIG. 5, for example.

Figure 6:
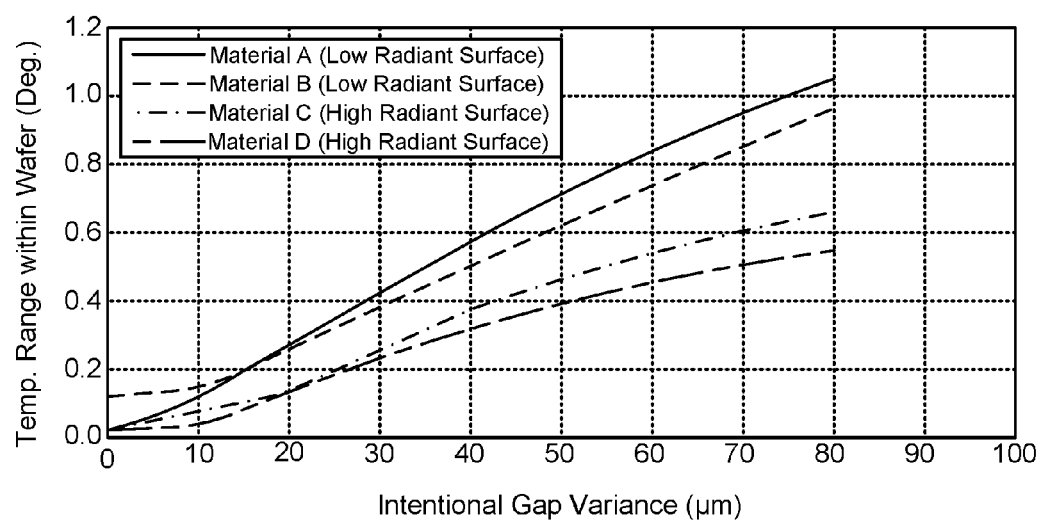
FIG. 6 illustrates a temperature range on a wafer with respect to gap variance.

FIG. 6 illustrates a temperature range on a wafer with respect to gap variance. As shown in FIG. 6, the temperature response to gap height is dependent upon the material comprising the wafer 202. Therefore, it is useful to perform some a priori testing of the temperature response of the wafer 202, and use the measured results as feedback for the control unit 112, to help determine appropriate wafer heights at various stages of the processing flow.

Figure 7:
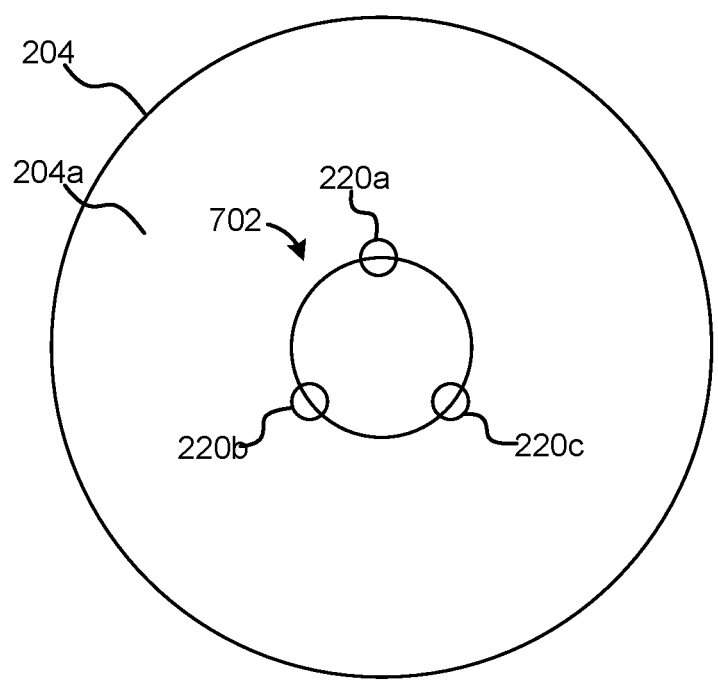
FIG. 7 illustrates an embodiment of a system for substrate thermal processing using a hot plate with a programmable array of lift devices for multi-bake process optimization.

FIG. 7 illustrates an embodiment that include a hot plate 108 having a programmable array 702 of lift devices 220a-220c for multi-bake process optimization. One such embodiment may include a base 204 with an upper surface 204a configured to receive the wafer 202. The base 204 may include at least one heater 110 (not shown) for heating the wafer 202 while on or in the vicinity of the base 204, a plurality of lift devices 220 configured to selectively extend from the upper surface 204a of the base 204 to support the wafer 202 above the base 204 when extended, and to allow the wafer 202 to rest in relatively close proximity to the upper surface 204a of the base 204 when retracted. In an embodiment, each lift device 220 may be actuated independently of the other lift devices 220 by an actuating mechanism comprising, for example, servos, or cylinders 208 shown in FIGS. 2-3. Additionally, the system 700 may include a controller 112, as shown in FIG. 1, for controlling the plurality of actuating mechanisms. In one embodiment, the lift devices 220 are arranged in a triangular orientation and may be spaced at an equilateral distance from the center of the hot plate 108 at a radius r, but one of ordinary skill in the art may recognize additional or alternative arrangements that may be suitable for use according to the present embodiments.

Figure 8:
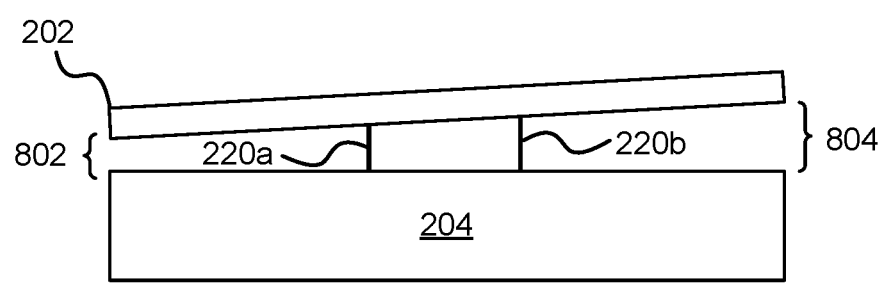
FIG. 8 illustrates an embodiment of a system for substrate thermal processing using a hot plate with a programmable array of lift devices for multi-bake process optimization.

FIG. 8 is a cross sectional view referring to FIG. The system 700 may include lift devices 220a and 220b, controller 112, and the base 204. In further embodiments, the plurality of lift devices 220 comprises two or more lift devices 220 and the controller 112 is configured to selectively vary the azimuthal orientation of the wafer 202 tilt among two or more different azimuthal orientations.

In an embodiment, the controller 112 is configured to actuate the plurality of actuating mechanisms to selectively tilt the wafer 202 with respect to the base 204 forming a non-uniform gap between the wafer 202 and the upper surface 204a of the base 204, the wafer 202 tilt having an azimuthal orientation. In such an embodiment the wafer 220 may be positioned at a first gap height 802 on one side and at a second gap height 804 on the second side, wherein the first gap height 802 and the second gap height 804 are different.

In an embodiment the lift devices 220 supporting the wafer 202 may receive actuating instructions by an actuating mechanism to lift the wafer 202 to the inclined position away from the base 204 with each lift devices 220 being actuated independently of the other lift devices 220.

In one embodiment the lift devices 220b are at a predetermined height and one or more lift devices 220a may retract into the base 204 to a height producing the smaller gap 802 the portion of the wafer 202 closer to the base 204. In another embodiment, the lift devices 220a are at a predetermined height and one or more lift devices 220b may extend out of the base 204 to a height producing the larger gap 804 the portion of the wafer 202 further away from the base 204. In one embodiment the lift devices 220a are at a predetermined height and one or more lift devices 220b may retract and/or extend in and/or out of the base 204 simultaneously to various heights producing the smaller gap 802 and larger gap 804.

FIG. 8 is a cross sectional view referring to FIG. 7 The system may include, lift devices 220, controller 112, and the base 204. The plurality of lift devices 220 comprises more than three lift devices 220 and the controller 112 is configured to selectively vary the azimuthal orientation of the wafer 202 tilt among more than three different azimuthal orientations. The controller 112 is configured to actuate the plurality of actuating mechanisms to selectively tilt the wafer 202 with respect to the base 204 forming a non-uniform gap between the wafer 202 and the upper surface 204a of the base 204, the wafer 202 tilt having an azimuthal orientation.

In an embodiment the lift devices 220 supporting the wafer 202 may receive actuating instructions by an actuating mechanism to lift the wafer 202 to the inclined position away from the base 204 with each lift devices 220 being actuated independently of the other lift devices 220. In one embodiment the lift devices 220 are at a predetermined height and one or more lift devices 220 may retract into the base 204 to a height producing the smaller gap 802 the portion of the wafer 202 closer to the base 204. In one embodiment the lift devices 220 are at a predetermined height and one or more lift devices 220 may extend out of the base 204 to a height producing the larger gap 804 the portion of the wafer 202 further away from the base 204. In one embodiment the lift devices 220 are at a predetermined height and one or more lift devices 220 may retract and/or extend in and/or out of the base 204 simultaneously to various heights producing the smaller gap 802 and larger gap 804. FIG. 9A illustrates an embodiment of a tilt axis of a wafer in a system for substrate thermal processing using a hot plate with a programmable array 702 of lift devices 220 for multi-bake process optimization.

FIG. 9A is the top view representing the first tilted position. With reference to FIG. 7 the system 700 shows an arrangement of three lift devices 220, wherein the three different azimuthal orientations are oriented at 60 degree angles with respect to each other. The arrow on the wafer 202 represents the direction of the first tilted position and extends from the top to the bottom of the wafer 202. The first tilted position forms the non-uniform gap between the wafer 202 and the upper surface of the base 204, producing a temperature inclining from the larger gap 804 to the smaller gap 802. The smaller gap 802 located at the top of the wafer 202 has higher temperature and the larger gap 804 located at the bottom has lower temperature.

FIG. 9B is the top view representing the second tilted position. With reference to FIG. 7 the system 700 shows an arrangement comprising of three lift devices 220, wherein the three different azimuthal orientations are oriented at 60 degree angles with respect to each other. The arrow represents the direction of the second tilted position and extends diagonally from the lower left to the upper right of the wafer 202. The second tilted position forms the non-uniform gap between the wafer 202 and the upper surface of the base 204, producing a temperature inclining from the larger gap 804 to the smaller gap 802. The smaller gap 802 located at the lower left of the wafer 202 has higher temperature and the larger gap 804 located at the upper right has lower temperature.

FIG. 9C is the top view representing the third tilted position. With reference to FIG. 7 the system 700 shows an arrangement of three lift devices 220, wherein the three different azimuthal orientations are oriented at 60 degree angles with respect to each other. The arrow represents the direction of the third tilted position and extends diagonally from the lower left to the upper right of the wafer 202. The third tilted position forms the non-uniform gap between the wafer 202 and the upper surface of the base 204, producing a temperature inclining from the larger gap 804 to the smaller gap 802. The smaller gap 802 located at the lower right of the wafer 202 has higher temperature and the larger gap 804 located at the upper left has lower temperature.

Although the varying tilt angles of FIG. 9A-9C have been described with relation to adjustment of the lifting devices 220 while maintaining the position of the notch 215, alternative embodiments exist. For example, the lift devices 220 may remain in a constant tilt position, and the orientation of the wafer 202 may be adjusted by a predetermined angle using, in an embodiment, the notch 215 on the wafer 202. In such an embodiment, the wafer 202 may be rotated in orientation by 60° while the lifting devices 220 remain in a constant position. Alternatively, a combination of adjusted configurations of the lift devices 220 and orientation of the wafer 202 using the notch 215 may achieve various further orientations, without limitation.

In FIG. 10A the parallel lines illustrated on the surface of the wafer 202 perpendicular to the direction of the arrow in FIG. 9A represent the temperature gradient as a result of the first tilted position. The temperature scale increments from the bottom larger gap 804 to top smaller gap 802 of the wafer 202.

In FIG. 10B the parallel lines illustrated on the surface of the wafer 202 perpendicular to the direction of the arrow in FIG. 9B represent the temperature gradient as a result of the second tilted position. The temperature scale increments from the upper right to lower left of the wafer 202. The intersection of gradient lines from the first and second tilt position represents an on-wafer location where a plurality of proximity sensors 104 may collect data of interest and so characterize the two bake processes that have been applied at that location.

In FIG. 10C the parallel lines illustrated on the surface of the wafer 202 perpendicular to the direction of the arrow in FIG. 9C represents the temperature gradient as a result of the third tilted position. The temperature scale increments from the upper left to lower right of the wafer 202. The gradient lines meshed from the first, second, and third tilt position provides the intersecting locations where the plurality of proximity sensors 104 may be positioned at those locations to collect data regarding the properties of the layers from the thermal processing method of a wafer 202 and characterize the behavior of the three bake conditions.

FIG. 11 illustrates temperature gradients resulting from the tilt of the wafer 202 at a set of gap heights. The actual gradient may not be perfectly linear as depicted in the rough graphics of FIGS. 10A-10C. In an embodiment, the actual temperature profile can be measured on wafer, and the isotherms established so that the full temperature history for any tilt condition is known. For example, FIG. 11 illustrates a temperature history for gaps at 1 mm, 5 mm, 10 mm, and 15 mm. In such an embodiment, the temperature of the bake plate may be set at 300° C. In such an embodiment, a title angle may be established, and the temperature range may vary by 8.01° C. at the 1 mm gap height, by 29.05° C. at the 5 mm gap height, by 41.09° C. at the 10 mm gap height and by 55° C. at the 15 mm gap height. One of ordinary skill will recognize that the temperature ranges may vary depending upon the tilt angle, bake chamber conditions such as humidity, gas concentrations, etc., and wafer materials.

Figure 12:
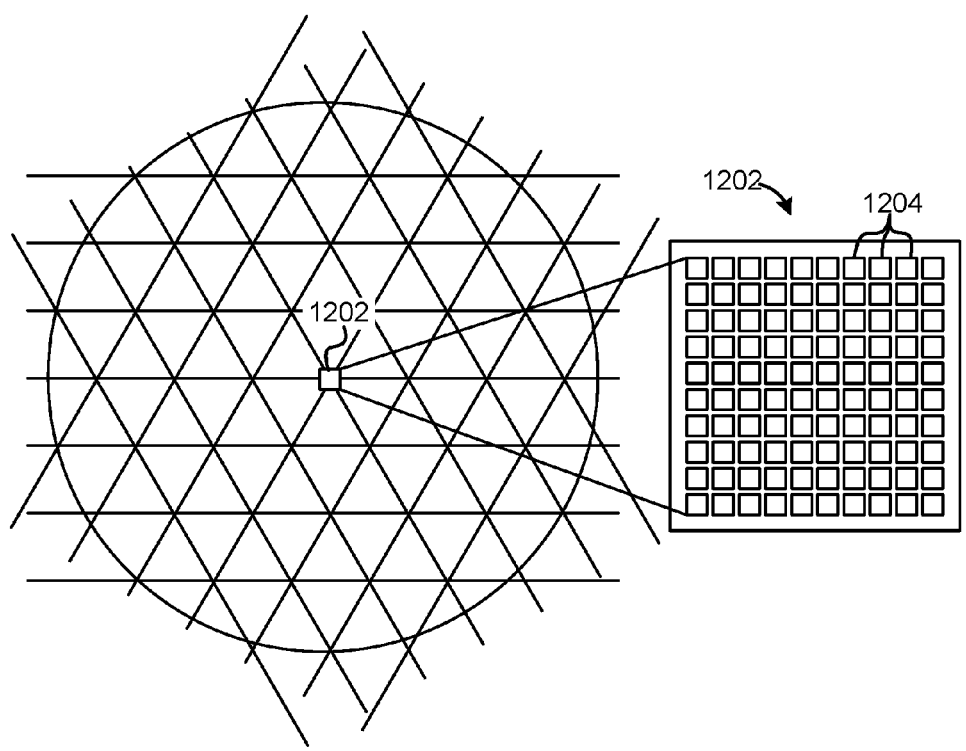
FIG. 12 illustrates an embodiment of a focus exposure matrix superimposed on three-axis bake matrix.

For example, an embodiment for evaluating a standard 193 nm photoresist on a bottom antireflective coating (BARC) is considered here. One of the first steps that is done in evaluating a photoresist is to measure its process window by varying the exposure dose and focus on the scanner. Usually, this is accomplished on a single wafer using only a single set of bake conditions (one for the BARC, one for the resist PAB, and one for the resist PEB). These conditions have an impact on the photoresist performance, but they are not typically measured at this point because of the number of wafers that would be involved in doing such a test. With the three-pin bake plate, all three bake conditions can be tested on a single wafer. FIG. 12 shows an embodiment of a test system for performing such a test.

FIG. 12 illustrates an embodiment of a focus exposure matrix 1202 comprised of multiple scanner shots 1204 superimposed on three-axis bake matrix. In an embodiment, very little area of the reticle is used, so this small area, illustrated as the scanner shots 1204 can be shot at different doses and foci within a small area on the wafer 202 as shown in the focus exposure matrix 1202. If this exercise is repeated at the different isotherm intersection points, then the focus/exposure process margin may be assessed across the different bake conditions, and operational conditions may be optimized. In an embodiment, the focus exposure matrix 1202 may characterize the impact of dose and focus on a resist patterning process. In prior systems, one wafer is typically required to check a single set of bake conditions for the patterning films. In the present embodiments, however, focus exposure matrix evaluations may be performed at each intersection point so that the impact of dose, exposure and the three temperatures of interest, for example: 1) underlayer bake, 2) SiARC bake, and 3) PEB. Such an embodiment allows a researcher to characterize an entire resist-patterning process on a single wafer.

In another example, the embodiment of FIG. 12 may be used for optimization of a directed self-assembly (DSA) processes. In such an embodiment, a pinning layer, a neutral layer, and a block copolymer may be coated as part of a chemo-epitaxial wafer flow. Each of these materials has its own bake window and behavior that drives the performance of the self-assembly. In exemplary DSA systems, the pinning and neutral layers are typically used in conjunction with traditional lithography to embed a chemical template into the wafer substrate. The block copolymer can then self-assemble on top of this chemical template. One embodiment would use a chemical template having commensurability with the block copolymer. In this case, the three azimuthal temperature axes could be used to characterize the temperature response of the neutral layer, the pinning layer, and the block copolymer to the overall self-assembly behavior. In another embodiment, a focus-exposure matrix 1202 can be used to vary the critical dimension of the chemical template at the intersection of the three azimuthal axes. In this case, the impact of the varying the dimensions of the chemical template can be coupled with the thermal process learning obtained by the three azimuthal temperature axes.

Although the present embodiments have been described in relation to a three-axis arrangement, one of ordinary skill in the art will recognize that more or fewer tilt axes may be used. For example, an embodiment having an array of four lift devices may provide four tilt axes. An embodiment having six lift devices may provide six tilt axes, etc.

Figure 13:
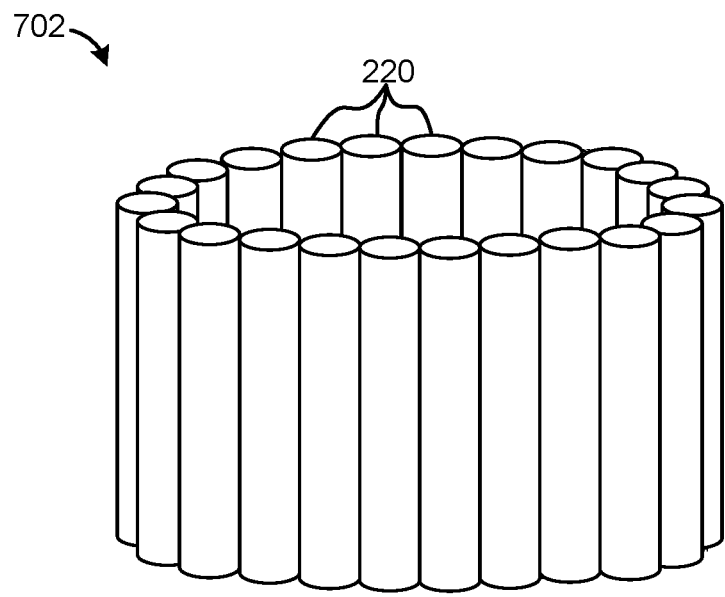
FIG. 13 illustrates one embodiment of an array of programmable lift devices.

FIG. 13 illustrates an enlarged view of a programmable array 702 of lift devices 220. A plurality of lift devices 220 is arranged in a circular array 702. Referring to FIG. 2 the components to actuate the lift devices 220 may include a common base and support arm 210, through holes 206, a plurality of actuating mechanism, and a base 204. The actuating mechanism receives commands from the controller 112 to activate movement of the lift devices 220 varying the azimuthal orientation of the wafer 202. The actuating mechanism may activate each lift devices 220 independently of the other lift devices 220, thereby lifting and lowering the wafer 202 from the base 204, so that many axes of variation may be accessed. In an embodiment, the actuating mechanism may configure the lifts devices 220 to tilt the wafer 202 with respect to the base 204 forming the non-uniform gap between the wafer 202 and the upper surface of the base 204. Embodiments of actuating mechanisms may include pneumatic, electromagnetic, piezoelectric, or magnetostrictive actuators, or a combination thereof.

In one embodiment the lift devices 220 are positioned at the bottom surface of the wafer 202 and interacts with the wafer 202 bottom surface through the through holes 206 to position the wafer 202 relative to the common base and support arm 210. In a further embodiment the lift devices 220 may be configured to selectively extend from the upper surface of the base 204 to support the wafer 202 above the base 204 when extended and allows the wafer 202 to rest on the upper surface of the base 204 when retracted. In a further embodiment the lift devices 220 may be configured to selectively to raise and lower the height of the lift devices 220 varying the azimuthal orientation of the wafer 202 among three different azimuthal orientations exposing the substrate to a thermal baking process or electromagnetic radiation. The lift devices 220 may be arranged in a circular layout in one embodiment, but other orientations may be used, depending on the system requirements and configurations. For example, the array 702 may be arranged in an elliptical pattern, a square pattern, or a rectangular pattern.

Figure 14:
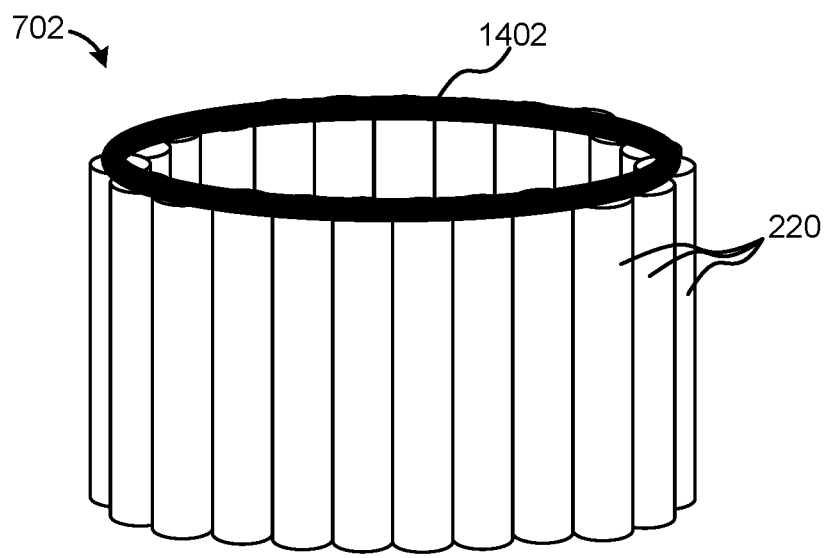
FIG. 14 illustrates one embodiment of an array of programmable lift devices.

FIG. 14 illustrates an enlarged view of the programmable array 702 of lift devices 220 arranged in a circular array configuration with a connector 1402. In an embodiment, the connector 1402 contacts a top surface of the array 702 of lift devices 220 and may be positioned between the array 702 of lift devices 220 and wafer 202. In an embodiment, the connector 1402 may be an annular connector 1402 that is attached to a top peripheral surface of the lift devices 220 to support the wafer 202. In some embodiments, the connector 1402 may comprise a material having a high coefficient of friction, such as rubber, or polymer configured to provide enhanced friction force between the array 702 of lift devices 220 and the wafer 202.

The connector 1402 may also serve as a cushion between the wafer 202 and lift devices 220 for stability, flexibility, support, or to provide a more consistent contact surface between the array 702 of lift devices 220 and the wafer 202. In such an embodiment, the connector maintains stability of the wafer 202 when the actuating mechanism actuates the lift devices 220 to various height tilting the wafer 202, thereby varying the azimuthal orientation.

Figure 15:
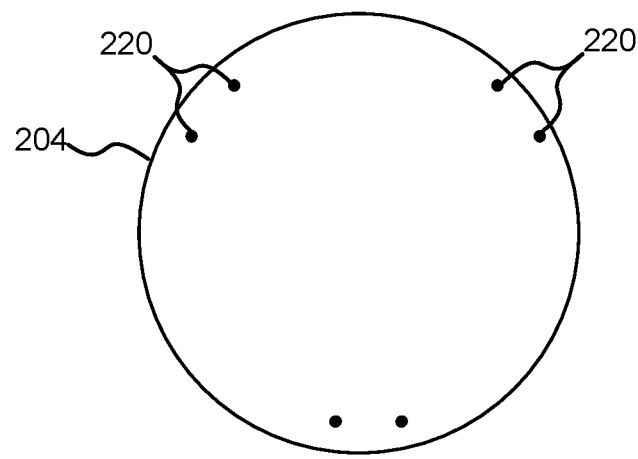
FIG. 15 is a top view diagram illustrating one embodiment of a hot plate having programmable lift devices.
Figure 16:
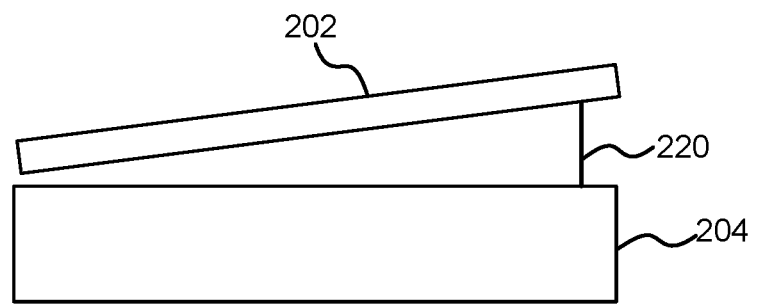
FIG. 16 is a side view diagram illustrating one embodiment of a hot plate having programmable lift devices.

FIG. 15 is a top view diagram, and FIG. 16 is a side view diagram illustrating one embodiment of a base 204 of a hot plate having programmable lift devices 220. The embodiment of FIG. 16 may differ from the previously described embodiments, because the lift devices may be disposed on a periphery of the base 204, rather than a more central region as shown in FIGS. 7-8, for example. A further difference illustrated in FIG. 15 is that the lift devices 220 may be arranged in pairs to enhance stability of the wafer 202.

Figure 17:
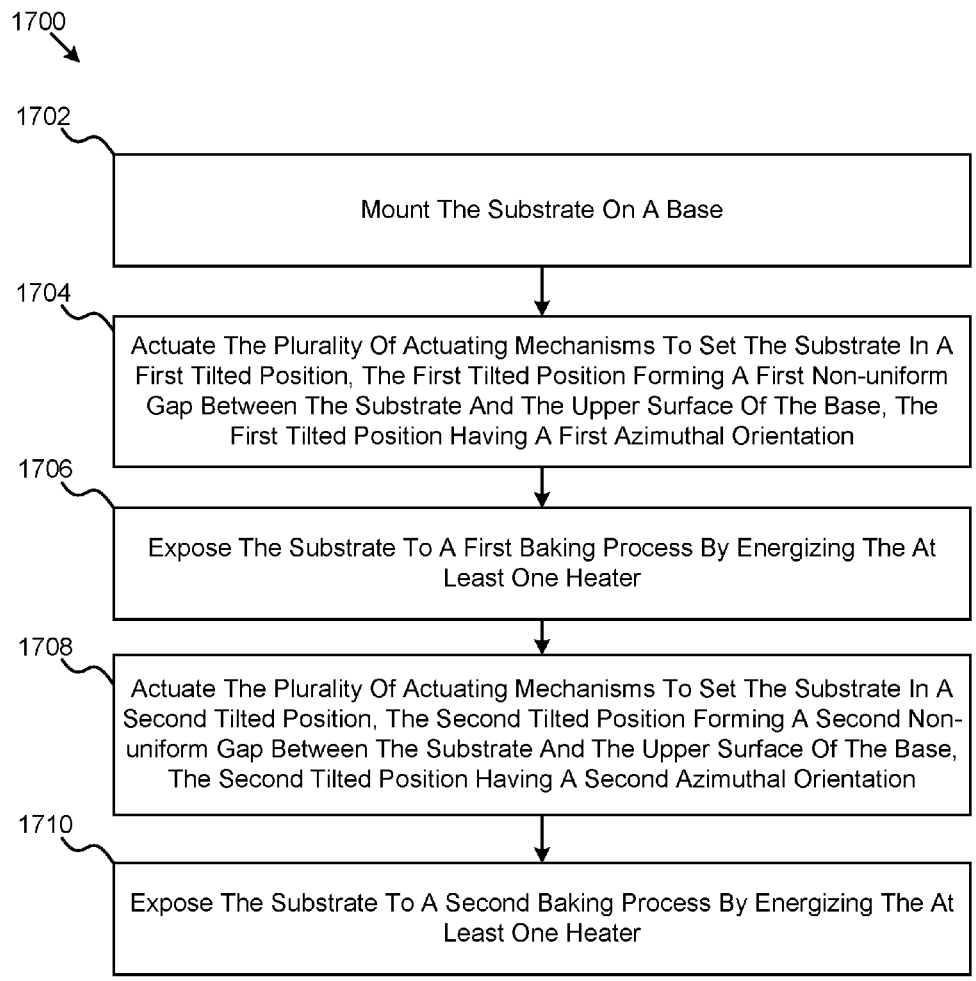
FIG. 17 is a flowchart diagram illustrating one embodiment of a method for substrate thermal processing using a hot plate with a programmable array of lift devices for multi-bake process optimization.

FIG. 17 is a flowchart diagram illustrating one embodiment of a method 1700 for substrate thermal processing using a hot plate with a programmable array of lift devices for multi-bake process optimization. An embodiment of a method 1700 includes mounting the substrate on a base, where the base includes an upper surface, at least one heater, and a plurality of lift devices configured to selectively extend from the upper surface of the base to support the substrate above the base when extended, and allow the substrate to rest on the upper surface of the base when retracted, each lift device being actuated independently of the other lift devices by an actuating mechanism, as shown at block 1702. Additionally, the method 1700 may include actuating the plurality of actuating mechanisms to set the substrate in a first tilted position, the first tilted position forming a first non-uniform gap between the substrate and the upper surface of the base, the first tilted position having a first azimuthal orientation as shown at block 1704. At block 1706, the method 1700 may further include exposing the substrate to a first baking process by energizing the at least one heater. In an embodiment, the method 1700 may also include actuating the plurality of actuating mechanisms to set the substrate in a second tilted position, the second tilted position forming a second non-uniform gap between the substrate and the upper surface of the base, the second tilted position having a second azimuthal orientation, as shown at block 1708. As shown at block 1710, the method 1700 may also include exposing the substrate to a second baking process by energizing at least one heater.

Figure 18:
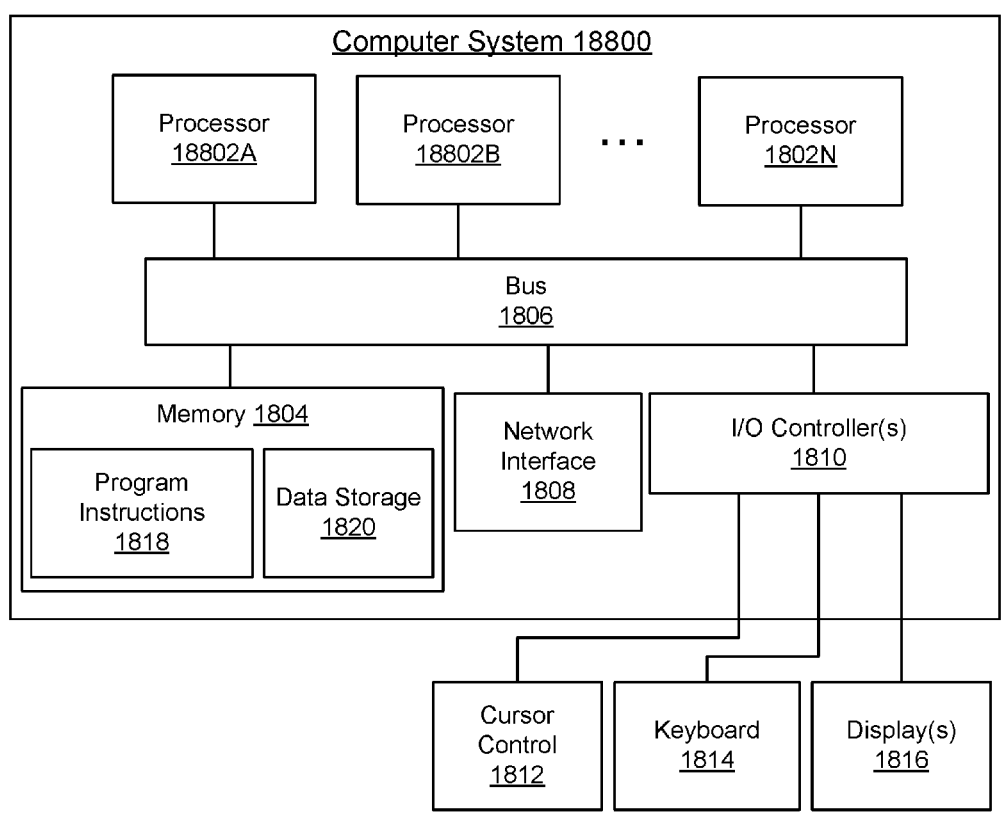
FIG. 18 is a schematic block diagram illustrating one embodiment of a data processing system specially configured for carrying out operations of a method for substrate thermal processing using a hot plate with a programmable array of lift devices for multi-bake process optimization.

FIG. 18 is a schematic block diagram illustrating one embodiment of a data processing system specially configured for carrying out operations of a method for substrate thermal processing using a hot plate 204 with a programmable array 702 of lift devices 220 for multi-bake process optimization. In one embodiment, controller 112 may be implemented on a computer system similar to the computer system 1800 described in FIG. 18. In some embodiments, the controller 112 may be implemented with application-specific logic, such as application specific integrated circuits (ASICs), micro-controllers, programmable logic chips (PLCs), or the like.

As illustrated, computer system 1800 includes one or more processors 1802A-N coupled to a system memory 1804 via bus 1806. Computer system 1800 further includes network interface 1808 coupled to bus 1806, and input/output (I/O) controller(s) 1810, coupled to devices such as cursor control device 1812, keyboard 1814, and display(s) 1816. In some embodiments, a given entity (e.g., controller 112) may be implemented using a single instance of computer system 1800, while in other embodiments multiple such systems, or multiple nodes making up computer system 1800, may be configured to host different portions or instances of embodiments.

In various embodiments, computer system 1800 may be a single-processor system including one processor 1802A, or a multi-processor system including two or more processors 1802A-N (e.g., two, four, eight, or another suitable number). Processor(s) 1802A-N may be any processor capable of executing program instructions. For example, in various embodiments, processor(s) 1802A-N may be general-purpose or embedded processors implementing any of a variety of instruction set architectures (ISAs), such as the x86, POWERPC®, ARM®, SPARC®, or MIPS® ISAs, or any other suitable ISA. In multi-processor systems, each of processor(s) 1802A-N may commonly, but not necessarily, implement the same ISA. Also, in some embodiments, at least one processor(s) 1802A-N may be a graphics processing unit (GPU) or another dedicated graphics-rendering device.

System memory 1804 may be configured to store program instructions and/or data accessible by processor(s) 1802A-N. For example, memory 1804 may be used to store software program and/or database shown in FIG. 17. In various embodiments, system memory 1804 may be implemented using any suitable memory technology, such as static random access memory (SRAM), synchronous dynamic RAM (SDRAM), nonvolatile/Flash-type memory, or any other type of memory. As illustrated, program instructions and data implementing certain operations, such as, for example, those described above, may be stored within system memory 1804 as program instructions 1818 and data storage 1820, respectively. In other embodiments, program instructions and/or data may be received, sent or stored upon different types of computer-accessible media or on similar media separate from system memory 1804 or computer system 1800. Generally speaking, a computer-accessible medium may include any tangible, non-transitory storage media or memory media such as electronic, magnetic, or optical media—e.g., disk or CD/DVD-ROM coupled to computer system 1800 via bus 1806, or non-volatile memory storage (e.g., "flash" memory)

In an embodiment, bus 1806 may be configured to coordinate I/O traffic between processor 1802, system memory 1804, and any peripheral devices including network interface 1808 or other peripheral interfaces, connected via I/O controller(s) 1810. In some embodiments, bus 1806 may perform any necessary protocol, timing or other data transformations to convert data signals from one component (e.g., system memory 1804) into a format suitable for use by another component (e.g., processor(s) 1802A-N). In some embodiments, bus 1806 may include support for devices attached through various types of peripheral buses, such as a variant of the Peripheral Component Interconnect (PCI) bus standard or the Universal Serial Bus (USB) standard, for example. In some embodiments, the operations of bus 1806 may be split into two or more separate components, such as a north bridge and a south bridge, for example. In addition, in some embodiments some or all of the operations of bus 1806, such as an interface to system memory 1804, may be incorporated directly into processor(s) 1802A-N.

Network interface 1808 may be configured to allow data to be exchanged between computer system 1800 and other devices, such as other computer systems attached to controller 112, for example. In various embodiments, network interface 1808 may support communication via wired or wireless general data networks, such as any suitable type of Ethernet network, for example; via telecommunications/ telephony networks such as analog voice networks or digital fiber communications networks; via storage area networks such as Fiber Channel SANs, or via any other suitable type of network and/or protocol.

I/O controller(s) 1810 may, in some embodiments, enable connection to one or more display terminals, keyboards, keypads, touch screens, scanning devices, voice or optical recognition devices, or any other devices suitable for entering or retrieving data by one or more computer system 200. Multiple input/output devices may be present in computer system 1800 or may be distributed on various nodes of computer system 1800. In some embodiments, similar I/O devices may be separate from computer system 1800 and may interact with computer system 1800 through a wired or wireless connection, such as over network interface 1808.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

As shown in FIG. 18, memory 1804 may include program instructions 1818, configured to implement certain embodiments described herein, and data storage 1820, comprising various data accessible by program instructions 1818. In an embodiment, program instructions 1818 may include software elements of embodiments illustrated in FIG. 17. For example, program instructions 1818 may be implemented in various embodiments using any desired programming language, scripting language, or combination of programming languages and/or scripting languages. Data storage 1820 may include data that may be used in these embodiments such as, for example, temperature profile data, pin program sequences, etc. In other embodiments, other or different software elements and data may be included.

A person of ordinary skill in the art will appreciate that computer system 1800 is merely illustrative and is not intended to limit the scope of the disclosure described herein. In particular, the computer system and devices may include any combination of hardware or software that can perform the indicated operations. In addition, the operations performed by the illustrated components may, in some embodiments, be performed by fewer components or distributed across additional components. Similarly, in other embodiments, the operations of some of the illustrated components may not be performed and/or other additional operations may be available. Accordingly, systems and methods described herein may be implemented or executed with other computer system configurations.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What we claim:

1. An apparatus for substrate thermal processing, the apparatus comprising:
   a base with an upper surface configured to receive the substrate, the base comprising:
      at least one heater for heating the substrate while on or in the vicinity of the base,
      a plurality of lift devices configured to selectively extend from the upper surface of the base to support the substrate above the base when extended, and allow the substrate to rest in proximity to the upper surface of the base when retracted, each lift device being actuated independently of the other lift devices by an actuating mechanism; and
   a controller for controlling the plurality of actuating mechanisms during heating of the substrate using the at least one heater to selectively tilt the substrate with respect to the base forming a non-uniform gap between the substrate and the upper surface of the base, the substrate tilt having an azimuthal orientation, and to selectively vary the azimuthal orientation of the substrate tilt, by selectively actuating each of the actuating mechanisms to vary a temperature gradient across the substrate during the heating.

2. The apparatus of claim 1, wherein the plurality of lift devices comprises three lift devices and the controller is configured to selectively vary the azimuthal orientation of the substrate tilt among three different azimuthal orientations.

3. The apparatus of claim 2, wherein the three different azimuthal orientations are oriented at 60° angles with respect to each other.

4. The apparatus of claim 1, wherein the plurality of lift devices comprises more than three lift devices and the controller is configured to selectively vary the azimuthal orientation of the substrate tilt among more than three different azimuthal orientations.

5. The apparatus of claim 1, wherein the plurality of lift devices are arranged in a circular array.

6. The apparatus of claim 5, further comprising a connector coupled to the plurality of lift devices arranged in the circular array.

7. The apparatus of claim 1, wherein the lift devices are arranged in pairs.

8. The apparatus of claim 7, wherein the pairs of lift devices are arranged at a peripheral region of the base plate.

9. The apparatus of claim 1, wherein the plurality of actuating mechanisms comprises pneumatic, electromagnetic, piezoelectric, or magnetostrictive actuators, or a combination thereof.

10. The apparatus of claim 1, wherein the at least one heater is a zoned heater.

11. The apparatus of claim 10, wherein the controller is configured to control a thermal energy level produced by the at least one heater.

12. A method of thermal processing a layer on a substrate, the method comprising:
   mounting the substrate on a base comprising:
      an upper surface;
      at least one heater, and
      a plurality of lift devices configured to selectively extend from the upper surface of the base to support the substrate above the base when extended, and allow the substrate to rest on the upper surface of the base when retracted, each lift device being actuated independently of the other lift devices by an actuating mechanism;
   actuating the plurality of actuating mechanisms to set the substrate in a first tilted position, the first tilted position forming a first non-uniform gap between the substrate and the upper surface of the base, the first tilted position having a first azimuthal orientation;
   exposing the substrate to a first baking process by energizing the at least one heater;
   actuating the plurality of actuating mechanisms to set the substrate in a second tilted position, the second tilted position forming a second non-uniform gap between the substrate and the upper surface of the base, the second tilted position having a second azimuthal orientation; and
   exposing the substrate to a second baking process by energizing the at least one heater.

13. The method of claim 12, further comprising:
   actuating the plurality of actuating mechanisms to set the substrate in a third tilted position, the third tilted position forming a third non-uniform gap between the substrate and the upper surface of the base, the third tilted position having a third azimuthal orientation; and
   exposing the substrate to a third baking process by energizing the at least one heater.

14. The method of claim 12, further comprising:
   exposing the layer on the substrate to electromagnetic radiation.

15. The method of claim 12, further comprising:
   evaluating the effect of varying time evolutions of substrate temperature across the layer during the first and second baking processes, on properties of the layer.

16. The method of claim 12, wherein the layer comprises photoresist.

17. The method of claim 12, wherein the layer is a neutral layer, pinning layer, template layer, or a block copolymer layer used in a directed self-assembly (DSA) process.

18. The method of claim 12, further comprising measuring a thermal response of a focus exposure matrix coupled to the substrate at the first baking process and the second baking process.

19. An apparatus for substrate thermal processing, the apparatus comprising:
   a base with an upper surface configured to receive the substrate, the base comprising:
      at least one heater for heating the substrate while on or in the vicinity of the base,
      a plurality of lift devices configured to selectively extend from the upper surface of the base to support the substrate above the base when extended, and allow the substrate to rest in proximity to the upper surface of the base when retracted, each lift device being actuated independently of the other lift devices by an actuating mechanism; and
   a controller for controlling the plurality of actuating mechanisms to selectively tilt the substrate with respect to the base forming a non-uniform gap between the substrate and the upper surface of the base, the substrate tilt having an azimuthal orientation, and to selectively vary the azimuthal orientation of the substrate tilt, by selectively actuating each of the actuating mechanisms,
   wherein the plurality of actuating mechanisms are configured to set the substrate in a first tilted position that forms a first non-uniform gap between the substrate and the upper surface of the base having a first azimuthal orientation, and to set the substrate in a second tilted position that forms a second non-uniform gap between the substrate and the upper surface of the base having a second azimuthal orientation, the second non-uniform gap being oriented at less than 180° from the first non-uniform gap and wherein the at least one heater is configured to heat the substrate in the first tilted position and to heat the substrate in the second tilted position.

* * * * *